(12) United States Patent
Jansen (10) Patent No.: US 10,883,816 B2
(45) Date of Patent: Jan. 5, 2021

(54) POSITION MEASUREMENT SYSTEM, ZEROING METHOD, LITHOGRAPHIC APPARATUS AND DEVICE MANUFACTURING METHOD

(71) Applicant: ASML NETHERLANDS B.V., Veldhoven (NL)

(72) Inventor: Maarten Jozef Jansen, Casteren (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/489,439

(22) PCT Filed: Feb. 6, 2018

(86) PCT No.: PCT/EP2018/052855
§ 371 (c)(1),
(2) Date: Aug. 28, 2019

(87) PCT Pub. No.: WO2018/171970
PCT Pub. Date: Sep. 27, 2018

(65) Prior Publication Data
US 2020/0191552 A1    Jun. 18, 2020

(30) Foreign Application Priority Data

Mar. 22, 2017 (EP) .................................. 17162292
Jan. 11, 2018 (EP) .................................. 18151242

(51) Int. Cl.
*G03F 7/20* (2006.01)
*G01B 9/02* (2006.01)

(52) U.S. Cl.
CPC ..... *G01B 9/02029* (2013.01); *G01B 9/02002* (2013.01); *G01B 9/02007* (2013.01); *G01B 9/02071* (2013.01); *G03F 7/70775* (2013.01)

(58) Field of Classification Search
CPC ............ G01B 9/02029; G01B 9/02007; G01B 9/02071; G01B 9/02002; G03F 7/70775
See application file for complete search history.

(56) References Cited

U.S. PATENT DOCUMENTS

2004/0080737 A1*  4/2004  Jasper ....................... G03F 9/70
                                                                    355/55
2006/0033931 A1*  2/2006  Lau ..................... G01B 9/02068
                                                                   356/493

(Continued)

FOREIGN PATENT DOCUMENTS

DE    102004037137    3/2006
DE    102010062842    6/2012

(Continued)

OTHER PUBLICATIONS

International Search Report issued in corresponding PCT Patent Application No. PCT/EP2018/052855, dated Apr. 26, 2018.

(Continued)

*Primary Examiner* — Steven Whitesell Gordon
(74) *Attorney, Agent, or Firm* — Pillsbury Winthrop Shaw Pittman LLP (57) ABSTRACT

A position measurement system configured to measure a position of an object, the system including: a displacement interferometer having a first capture range; a time-of-flight sensor having a second capture range that is larger than the first capture range and having an inaccuracy that is smaller than the first capture range; and a processing unit, wherein the position measurement system has a zeroing mode in which the processing unit is configured to determine a coarse position of the object within the second capture range based on an output from the time-of-flight sensor, and in which the processing unit is configured to determine a fine (Continued)

position of the object based on the determined coarse position and an output from the displacement interferometer.

20 Claims, 4 Drawing Sheets

(56) References Cited

U.S. PATENT DOCUMENTS

| | | | |
|---|---|---|---|
| 2009/0257067 A1* | 10/2009 | Chapman | G01B 9/02029 |
| | | | 356/498 |
| 2010/0129741 A1 | 5/2010 | Bijvoet | |
| 2011/0213584 A1 | 9/2011 | Menchtchikov et al. | |
| 2014/0307264 A1 | 10/2014 | Luthi et al. | |

FOREIGN PATENT DOCUMENTS

| | | |
|---|---|---|
| EP | 1970666 | 9/2008 |
| JP | 2005525548 | 8/2005 |
| JP | 2010014549 | 1/2010 |
| JP | 2010123950 | 6/2010 |
| JP | 2011027649 | 2/2011 |
| WO | 2017021299 | 2/2017 |

OTHER PUBLICATIONS

Meiners-Hagen, Karl, et al.: "Absolute distance interferometer in LaserTracer geometry", MacroScale 2011.
Japanese Office Action issued in corresponding Japanese Patent Application No. 2019-552137, dated Oct. 27, 2020.

* cited by examiner

POSITION MEASUREMENT SYSTEM, ZEROING METHOD, LITHOGRAPHIC APPARATUS AND DEVICE MANUFACTURING METHOD

BACKGROUND

Cross Reference to Related Applications

This application is the U.S. national phase entry of PCT Patent Application No. PCT/EP2018/052855, filed Feb. 6, 2018, which claims priority of European patent application no. application 17162292.1, which was filed on Mar. 22, 2017, and of European patent application no. application 18151242.7, which was filed on Jan. 11, 2018, and which are incorporated herein in their entirety by reference.

Field of the Invention

The present invention relates to a position measurement system, a method for zeroing the position measurement system, a lithographic apparatus comprising such a position measurement system and a device manufacturing method in which use is made of such a position measurement system.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatus usually comprise a plurality of moveable components of which the position needs to be known very accurately to obtain an accurate transfer of the pattern to the target portion. Key in obtaining the position are position measurement systems. Depending on the application and the required accuracy, the position measurement systems may be based on the principle of letting two measurement beams interfere with each other after at least one of the measurement beams has interacted with an object, e.g. a target, on the moveable component to change the phase of the measurement wave(s). By detecting the intensity after interference a signal can be obtained that represents the phase difference between the measurement beams. The signal is thus also representative of the position of the moveable component.

Position measurement systems which are based on relative displacement measuring principles such as an interferometer usually have a zeroing mode to determine an absolute position reference that can be used in the subsequent measuring of relative displacement of the object to determine the position of the object. Zeroing is for instance performed after an interruption of a measurement beam occurs and position information is lost.

Without additional sensors, the capture range of a single wavelength interferometer is only in the order of a fraction of the wavelength, which is not sufficient. The capture range of the interferometer may be increased using a multiwavelength interferometer which combines information from different wavelengths to form an effective wavelength much larger than the individual wavelengths. The effective wavelength may alternatively be referred to as synthetic wavelength. Alternatively, a position sensitive device may be used for zeroing purposes which measures the centroid position of a beam that has interacted with the object.

However, drawbacks of the current zeroing methods is that when the distance between light source and object increases, the capture range even with the use of additional wavelengths or sensors is not sufficient or the accuracy is not good enough. A further drawback is that additional sensors take up extra volume and measure against different targets on a moveable components than the interferometer.

SUMMARY

It is desirable to provide a position measurement system which has an improved capture range and/or improved accuracy.

According to an embodiment of the invention, there is provided a position measurement system configured to measure a position of an object, comprising:
a displacement interferometer having a first capture range;
a time-of-flight sensor having a second capture range that is larger than the first capture range and having an inaccuracy that is smaller than the first capture range; and
a processing unit,
wherein the position measurement system has a zeroing mode in which the processing unit is configured to determine a coarse position of the object within the second capture range based on an output from the time-of-flight sensor,
and in which the processing unit is configured to determine a fine position of the object based on the determined coarse position and an output from the displacement interferometer.

According to a further embodiment of the invention, there is provided a position measurement system configured to measure a position of an object, comprising:
a tunable light source;
an acoustic-optic modulator for acting on radiation emitted by the tunable light source;
a dispersion compensator for acting on the same radiation as the acousto-optic modulator.

According to another embodiment of the invention, there is provided a lithographic apparatus comprising a position measurement system according to the invention, wherein the object is part of the lithographic apparatus.

According to yet another embodiment of the invention, there is provided a method for zeroing a position measurement system configured to measure a position of an object, comprising:
a displacement interferometer having a first capture range; and a time-of-flight sensor having a second capture range that is larger than the first capture range and having an inaccuracy that is smaller than the first capture range, wherein the method comprises the following steps:

a) determining a coarse position of the object within the second capture range using the time-of-flight sensor; and
b) determining a fine position of the object using the displacement interferometer and the determined coarse position.

According to a further embodiment of the invention, there is provided a device manufacturing method wherein use is made of a position measurement system according to the invention or a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
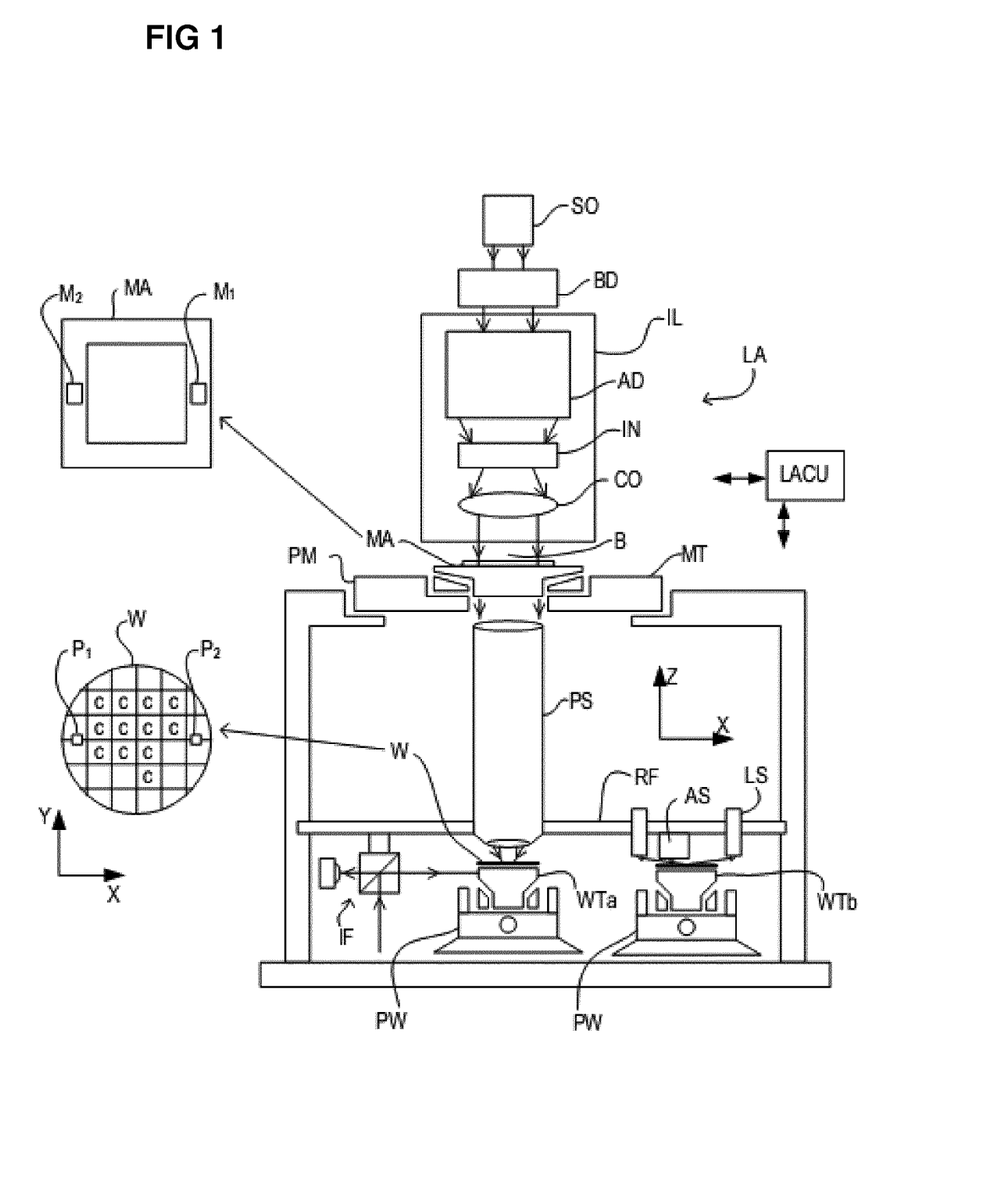
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
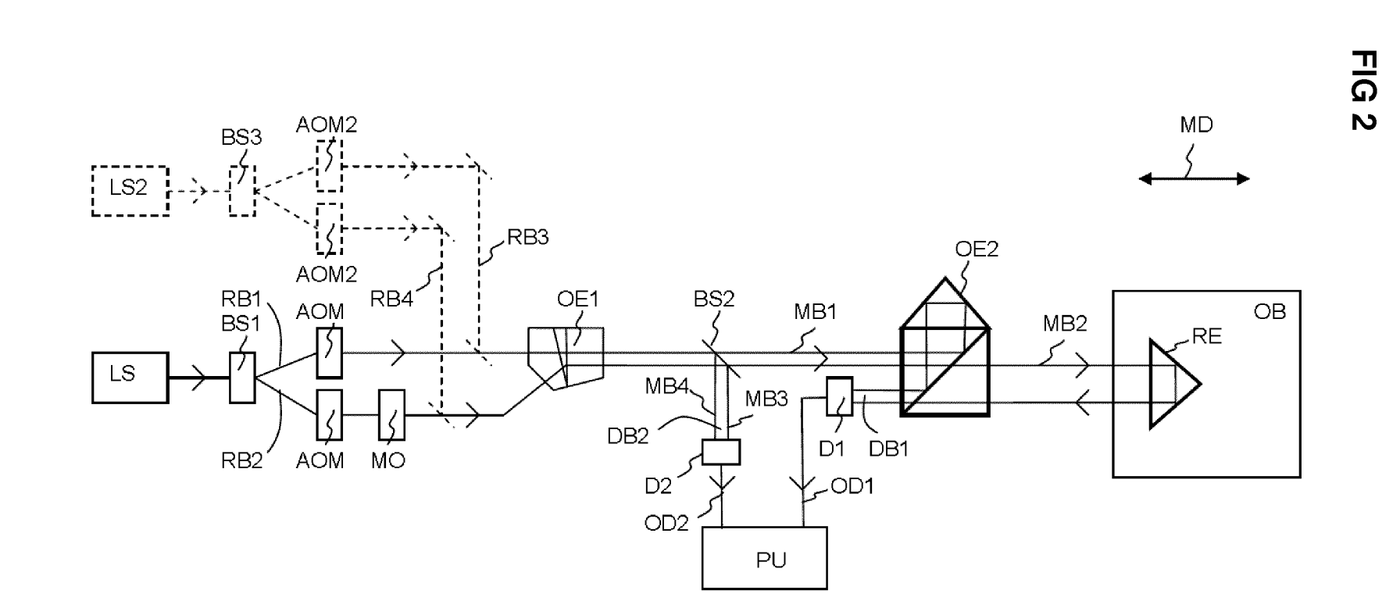
FIG. 2 schematically depicts a position measurement system according to an embodiment of the invention.

FIG. 2 schematically depicts a position measurement system of the lithographic apparatus of FIG. 1 to measure a position of an object OB that is moveable in a direction indicated by arrow MD. The moveable object OB is described here in general as an example, but in practice can be any moveable component of the lithographic apparatus, for example the support structure MT constructed to support a patterning device MA, the substrate table WT or an optical element of the projection system PS.

The position measurement system of FIG. 2 includes a light source LS, in this example a heterodyne light source LS, which outputs a first radiation beam RB1 having a first polarization and a second radiation beam RB2 having a second polarization different from the first polarization. The first and second radiation beams RB1, RB2 are separated from each other using a first beam splitter BS1 to pass an acousto-optic modulator AOM to adjust the frequencies of the first and second radiation beams RB1, RB2. Hence, the first radiation beam RB1 has a first frequency and the second radiation beam RB2 has a second frequency different from the first frequency.

The position measurement system further includes a first optical element OE1, a second beam splitter BS2, a second optical element OE2, a first detector D1, a second detector D2 and a processing unit PU. The first optical element OE1, the second beam splitter BS2, and the second optical element OE2 are part of an optical system also including the heterodyne light source LS, the first beam splitter BS1 and the acousto-optic modulators AOM.

The optical system obtains a first measurement beam MB1 from the first radiation beam RB1 and guides the first measurement beam MB1 along a first optical path starting at the first optical element OE1, past the second beam splitter BS2 towards the second optical element OE2 and subsequently towards the first detector D1 without interacting with the object OB.

The optical system further obtains a second measurement beam MB2 from the second radiation beam RB2 and guides the second measurement beam MB2 along a second optical path starting at the first optical element OE1, past the second beam splitter BS2 and second optical element OE2 to interact with a reflector RE on the object, and subsequently passing the second optical element OE2 again towards the first detector D1. Although the reflector RE is here embodied as retroreflector, it is also possible that a plane mirror is used as reflector RE.

Between the second optical element OE2 and the first detector D1, the first and second measurement beam MB1, MB2 are allowed to at least partially interfere with each other to form a first detection beam DB1 received by the first detector D1.

The way the first and second measurement beams MB1, MB2 interfere with each other depends on a phase difference between the first and second measurement beams MB1, MB2 which in turn depends on a difference in length between the first optical path and the second optical path.

The difference in length is dependent on a position of the reflector RE on the object OB. Hence, an output OD1 of the first detector D1 is representative of a position of the object OB.

The optical system also obtains a third measurement beam MB3 from the first radiation beam RB1 and guides the third measurement beam MB3 along a third optical path starting at the first optical element OE1 and via the second beam splitter BS2 towards the second detector D2.

The optical system further obtains a fourth measurement beam MB4 from the second radiation beam RB2 and guides the fourth measurement beam MB4 along the same third optical path as the third measurement beam.

Between the second beam splitter BS2 and the second detector D2, the third and fourth measurement beam MB3, MB4 are allowed to at least partially interfere with each other to form a second detection beam received by the second detector D2.

The interference of the third and fourth measurement beams MB3, MB4 can form a reference to accurately determine a phase that relates to the optical path difference between the first and second measurement beams MB1, MB2 as inaccuracies caused by variations in the optical system upstream of the second beam splitter BS2, including variations in the light source LS then cancel out when comparing the interference of the first and second measurement beams MB1, MB2 and the interference of the third and fourth measurement beams MB3, MB4.

The position measurement system further comprises a modulator MO to phase modulate or amplitude modulate or polarization modulate the second radiation beam RB2. The modulated second radiation beam RB2 forms the basis for the second and fourth measurement beams MB2, MB4. The second measurement beam MB2 is guided along the second optical path to interact with the reference RE on the object OB and be received by the first detector D1. The fourth measurement beam MB4 is guided along the third optical path to be received by the second detector D2. Hence, the modulated signal imposed on the second measurement beam MB2 and the fourth measurement beam MB4 is detectable by both the first and second detector D1, D2, wherein a time difference between the moment the modulated signal is detected at the first detector D1 and the moment the modulated signal is detected at the second detector D2 depends on a difference in optical path length between the second optical path and the third optical path and thus on the position of the object OB in the direction MD. In other words, the phase difference between the detected modulated signal at the first and second detectors D1, D2 depends on a difference in optical path length between the second optical path and the third optical path and thus on the position of the object OB in the direction MD.

Hence, the position measurement system comprises a displacement interferometer in which the position of the object OB is measured based on interference and a time-of-flight sensor in which the position of the object OB is measured based on time-of-flight. An advantage of this position measurement system according to FIG. 2 is that the displacement interferometer and the time-of-flight sensor are integrated by sharing optical components. The displacement interferometer and the time-of-flight sensor even share that many optical components that the modulated signal used for the time-of-flight measurement is superimposed on the measurement beam used for interference measurement thereby enabling to use the same detectors for both measurements.

The position measurement system further comprises a processing unit PU receiving the output OD1 of the first detector D1 and the output OD2 of the second detector D2 which outputs OD1, OD2 comprise information, i.e. a first output, from the time-of-flight sensor, and information, i.e. a second output, from the displacement interferometer.

An advantage of using a combination of a displacement interferometer and a time-of-flight sensor is that a relatively high accuracy, but a relatively small first capture range of the displacement sensor is combined with a relatively low accuracy, but a relatively large second capture range of the time-of-flight sensor. When the inaccuracy of the time-of-flight sensor is smaller than the first capture range, the time-of-flight sensor can be used in a zeroing mode to determine firstly a coarse position of the object OB from the first output and subsequently the displacement interferometer can be used to determine a fine position of the object OB based on the second output and the determined coarse position. The inaccuracy of the time-of-flight sensor is the range in which a measured value of a certain position of the object OB can vary, due to imperfections of the measurement with the time-of-flight sensor. The smaller the inaccuracy, the more accurate the time-of-flight sensor will be. When the inaccuracy of the time-of-flight sensor is smaller than the first capture range, the uncertainty with which the time-of-flight sensor can determine the coarse position of the object OB is within a smaller range than the first capture range.

Hence, the position measurement system has a zeroing mode in which the processing unit PU is configured to receive a first output from the time-of-flight sensor and to determine a first signal representative of a coarse position of the object OB from the first output OD1 within the second capture range, and wherein the position measurement system has a measuring mode in which the processing unit PU is configured to receive a second output OD2 from the displacement interferometer and to determine a second signal representative of a fine position of the object OB from the second output OD2 and the first signal.

Due to the fact that the time-of-flight sensor and the displacement interferometer can be used simultaneously, it is preferred in this embodiment, that the modulation frequency introduced by the modulator MO is substantially different from a difference in frequency between the first and second radiation beam RB1, RB2 downstream of the acousto-optic modulators AOM as this makes it easier for the processing unit to differentiate between the first output OD1 and the second output OD2.

So far, the displacement interferometer has been described as a single wavelength interferometer, but in dashed lines, an extension of the displacement interferometer is shown turning the displacement interferometer into a multiwavelength interferometer.

The extension shows a second light source LS2 and a third beam splitter BS3 providing a third radiation beam RB3 and a fourth radiation beam RB4. Both the third and fourth radiation beams RB3, RB4 pass an acousto-optic modulator AOM2, such that downstream of the acousto-optic modulators AOM2, the frequency of the third and fourth radiation beams RB3, RB4 differ from each other. Preferably, the difference in frequency between the third and fourth radiation beams RB3, RB4 downstream of the acousto-optic modulators AOM2 is substantially different from the difference in frequency between the first and second radiation beams RB1, RB2 downstream of the acousto-optic modulators AOM to allow the processing unit to easily distinguish the different wavelengths.

The third radiation beam RB3 is then combined with the first radiation beam RB1 so that a portion of the third radiation beam RB3 is guided along the first optical path and another portion of the third radiation beam RB3 is guided along the third optical path. The fourth radiation beam RB4 is combined with the second radiation beam RB2 so that a portion of the fourth radiation beam RB4 is guided along the second optical path and another portion of the fourth radiation beam RB4 is guided along the third optical path.

The working principle of the interferometer for the third and fourth radiation beams RB3, RB4 is similar to the first and second radiation beams RB1, RB2, so that the outputs OD1, OD2 of the first and second detector D1, D2 now also include information related to a phase difference between the interference of radiation from the second light source LS2 at the first detector D1 and the interference of radiation from the second light source LS2 at the second detector D2, which is also representative of the position of the object OB.

In case the displacement interferometer is a multiwavelength interferometer, the information from the different wavelengths can be combined to form an effective wavelength. As an example, when two different wavelengths $\lambda_1$, $\lambda_2$ are used, an effective wavelength $\Lambda_{eff}$ can be formed which yields:

$$\Lambda_{eff} = \frac{\lambda_1 \lambda_2}{|\lambda_1 - \lambda_2|}$$

The first capture range of the displacement interferometer is then extended to be the capture range corresponding to the effective wavelength which is larger than a third capture range corresponding to an individual wavelength, i.e., one of the different wavelengths $\lambda_1$, $\lambda_2$ in case two different wavelengths are used. Determining the fine position of the object OB is then a two step process in which first a refined position of the object OB within the first capture range is determined by the processing unit PU based on the determined coarse position and the second output from the displacement interferometer related to the effective wavelength, and subsequently the fine position of the object OB is determined by the processing unit PU based on the determined refined position and a third output from the displacement interferometer related to the individual wavelength, wherein an inaccuracy of the determined refined position is smaller than the third capture range of the individual wavelength.

The processing unit PU is configured to receive a first output from the time-of-flight sensor and to determine a first signal SI1 representative of a coarse position of the object OB from the first output in the zeroing mode. Further the processing unit PU is configured to receive the second output and the third output from the displacement interferometer, to combine the information from the second output and the third output to form an effective wavelength with a corresponding third capture range smaller than the second capture range and larger than the first capture range, and to determine a third signal SI3 representative of the position of the object within the third capture range based on the coarse position and the combined information from the second and third outputs in a refining mode. In a measuring mode, the processing unit PU is configured to determine a second signal representative of a fine position of the object OB from the second output and the third signal SI3.

As already mentioned, an advantage of the position measurement system of FIG. 2 is that the time-of-flight sensor and the displacement interferometer are simultaneously operational. However, it is also possible that the position measurement system is adjustable to operate either as time-of-flight sensor or as displacement interferometer, so that for coarse position measurement the position measurement system is operated as time-of-flight sensor and subsequently for fine position measurement the position measurement system is operated as displacement interferometer. An example of such a position measurement system will be described below by reference to FIG. 3.

Figure 3:
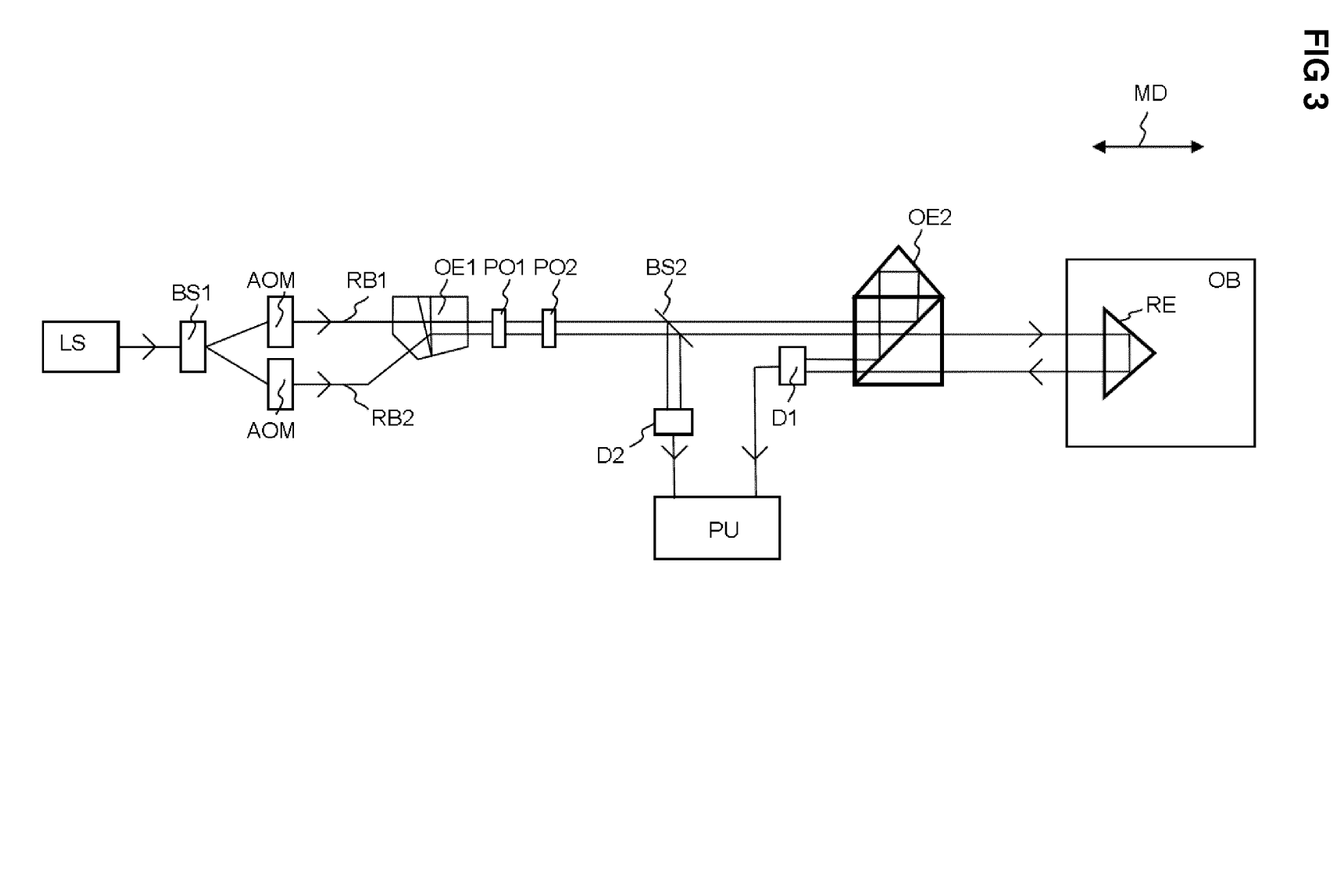
FIG. 3 schematically depicts a position measurement system according to another embodiment of the invention.

FIG. 3 depicts a position measurement system according to another embodiment of the invention to measure a position of an object OB. The position measurement system has many similarities with the position measurement system of FIG. 2 and comprises for instance similar optical components such as light source LS, first beam splitter BS1, acousto-optic modulators AOM, first optical element OE1, second beam splitter BS2, second optical element OE2, first detector D1, and second detector D2. The object OB is provided with a similar reference RE allowing the position measurement system to interact with the object for measuring the position of the object. The position measurement system is further provided with a similar processing unit PU.

The main difference between the position measurement system of FIG. 2 and the position measurement system of FIG. 3 is the absence of modulator MO and the presence of two polarizers PO1, PO2 in the position measurement system of FIG. 3.

Both polarizers PO1, PO2 are operable to either interact with the first and second radiation beams RB1, RB2 passing the polarizers PO1, PO2, or to let the first and second radiation beams RB1, RB2 pass without interaction, so that the position measurement system is adjustable to operate as time-of-flight sensor or to operate as displacement interferometer instead.

In case the polarizers PO1, PO2 do not interact with the first and second radiation beams RB1, RB2, e.g. as the polarizers are moved out of the optical path, the position measurement system operates as a displacement interferometer. The working principle of the displacement interferometer is then similar to the working principle of the displacement interferometer of FIG. 2 (single wavelength embodiment) and will not be unduly repeated here.

By allowing the polarizers PO1, PO2 to interact with the first and second radiation beams RB1, RB2, the position measurement system is switched to operate as time-of-flight sensor.

The first polarizer PO1 is configured to mix the first and second radiation beam RB1, RB2 so that a modulated measurement beam is created with a modulation frequency equal to the difference in frequency between the first and second radiation beams RB1, RB2.

The second polarizer PO2 is configured to ensure that the modulated measurement beam is either only guided along the first optical path or only along the second optical path. When the polarizer PO2 is set to allow the modulated measurement beam to be guided along the first optical path, the time-of-flight of the modulated measurement beam to the first detector depends on the length of the first optical path, which in principle is static. Hence, this measurement can be used as a reference. When the polarizer PO2 is set to allow the modulated measurement beam to be guided along the second optical path, the time-of-flight of the modulated measurement beam to the first detector depends on the length of the second optical path, which in turn depends on the position of the object OB.

Although the shown embodiments show a relatively high degree of integration between time-of-flight sensor and displacement interferometer by sharing a lot of optical components, which is advantageous due to the limited additional space required for the combination, the invention is not limited to integrating the time-of-flight sensor and displacement interferometer. Hence, no integration is required at all.

For instance, in an alternative embodiment, the time-of-flight sensor and displacement interferometer do not share the light source, but use distinct light sources. The displacement interferometer then uses a heterodyne light source or any other light source suitable for interferometer purposes and the time-of-flight sensor uses another light source to provide a modulated measurement beam with a different wavelength then used for interferometry, e.g. a LED or laser, for instance to use infrared wavelength.

In another alternative embodiment, the time-of-flight sensor and the displacement interferometer do not share detectors, but use separate detectors, for instance when the time-of-flight sensor uses radiation with a different wavelength, e.g. infrared, or the modulation frequency is such that the detectors used for interferometry are not suitable.

Although the mentioned modulation has not always been described in detail, it is noted here that any kind of modulation, whether phase modulation, amplitude modulation or polarization modulation, can be used for time-of-flight measurements.

Although the shown embodiments show a single-pass displacement interferometer, i.e. only a single interaction with the reference RE on the object, the invention can also be applied to a multi-pass displacement interferometer, e.g. double pass, quadruple pass, 4-pass.

Although the shown embodiments relate to a heterodyne displacement interferometer, the invention can also be applied to a homodyne interferometer.

Although the shown embodiments describe the time-of-flight measurement as a time difference between the time-of-flight of two different modulated measurement beams to a detector, it is also possible that the signal applied to the modulator MO is used as a reference to determine the time-of-flight and subsequently the position of the object.

Referring to the embodiment of FIG. 2, it is for instance possible that another modulator is arranged in the first radiation beam to affect the first and third measurement beams MB1, MB3 thus allowing a measurement of the position of the reference in the second optical element OE2 relative to the second detector D2. Hence, the position of the reference in the second optical element OE2 relative to the detector D2 and the position of the reflector RE relative to D2 can be derived by means of a time-of-flight measurement and subsequently the optical path length difference between the reference in the second optical element OE2 and the reflector RE can be derived therefrom.

In an embodiment, when a multiwavelength interferometer is used, a wavelength tracker may be added to the interferometer to detect and be able to compensate for wavelength drift in the processing unit PU.

Referring back to FIG. 2, the light source LS and the second light source LS2 have been described as light sources outputting radiation with a substantially fixed wavelength, at least a non-tunable wavelength. However, for some purposes it may be advantageous when the light source LS and/or the second light source LS2 are a tunable light source allowing to set the light source to output radiation with any wavelength within a predetermined wavelength range. An advantage thereof may be that a single tunable light source can be used to replace a number of fixed wavelength light sources while maintaining the same functionality and accuracy. Another advantage thereof may be that the system can be converted to an absolute distance measurement system allowing zeroing using frequency modulation of a so-called continuous light source wave.

Figure 4:
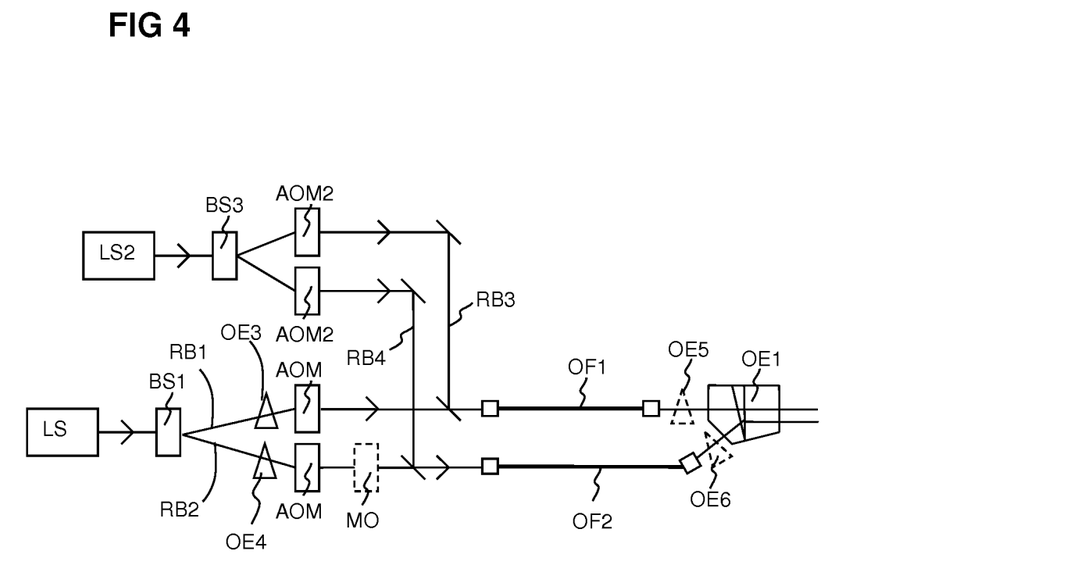
FIG. 4 schematically depicts a part of a position measurement system according to a further embodiment of the invention.

An embodiment in which a tunable light source is used can be seen in FIG. 4, which FIG. 4 shows schematically a part of a position measurement system according to a further embodiment of the invention. The position measurement system may be part of a lithographic apparatus according to FIG. 1 to measure a position of an object similar to the embodiment of FIG. 2. The part shown in FIG. 4 is similar to the part of FIG. 2 that is left of the first optical element OE1.

The position measurement system of FIG. 4 includes a light source LS, in this example a tunable heterodyne light source LS, e.g. a heterodyne laser source, which outputs a first radiation beam RB1 having a first polarization and a second radiation beam RB2 having a second polarization different from the first polarization. The first and second radiation beams RB1, RB2 are separated from each other using a first beam splitter BS1 in order to pass a corresponding acousto-optic modulator AOM to adjust the frequencies of the first and second radiation beam RB1, RB2. Hence, after passing the modulators AOM the first radiation beam RB1 has a first frequency and the second radiation beam RB2 has a second frequency different from the first frequency. The modulators AOM are used to set a frequency difference between the first and second radiation beam RB1, RB2, while the tunable light source LS can be set to output radiation with a predetermined basic wavelength or frequency that can be chosen from a respective predetermined range.

The position measurement system further includes a first optical element OE1 directing the radiation beams RB1, RB2 towards the rest of the optical system similar to FIG. 2. This part will not be described in detail again and reference is made to the corresponding description of this part in relation to FIG. 2.

The position measurement system optionally comprises a modulator MO to phase modulate or amplitude modulate the second radiation beam RB2. The usage and benefits of the modulator MO are similar to the system of FIG. 2.

The position measurement system comprises a second light source LS2 and a third beam splitter BS3 providing a third radiation beam RB3 and a fourth radiation RB4. The second light source LS2 in this embodiment is a fixed-wavelength light source outputting radiation with a substantially fixed wavelength or frequency.

Both the third and fourth radiation beam RB3, RB4 pass an acousto-optic modulator AOM2, such that downstream of the acousto-optic modulators AOM2, the frequency of the third and fourth radiation beam differ from each other. Preferably, the difference in frequency between the third and fourth radiation beam RB3, RB4 downstream of the modulators AOM2 is substantially different from the difference in frequency between the first and second radiation beam RB1, RB2 downstream of the modulators AOM to allow the system, e.g. a processing unit thereof, to easily distinguish the different wavelengths.

In this embodiment, the first radiation beam RB1 and the third radiation beam RB3 are provided to a first optical fiber OF1, which in turn provides the radiation beams RB1, RB3 to the first optical element OE1. Similarly, the second radiation beam RB2 and the fourth radiation beam RB4 are provided to a second optical fiber OF2, which in turn provides the radiation beams RB2, RB4 to the first optical element OE1.

In the embodiment of FIG. 4, a tunable light source LS is combined with acousto-optic modulator AOM, which introduces a wavelength dependent angular deflection upon passing the acousto-optic modulator. This may result in fiber coupling variations for both the first and second optical fiber OF1, OF2. Fiber coupling efficiency may decrease with increasing width of the wavelength range used. In some cases, the fiber coupling efficiency loss may be acceptable only for a very small tuning range in the order of a few tenths of a nanometer while larger tuning ranges, in the order of 5 nanometers or more are preferred. The wavelength dependent angular deflection may alternatively be referred to as wavelength dependent angular dispersion or in short dispersion.

In order to compensate for the dispersion caused by the acousto-optic modulator AOM, the system of FIG. 4 comprises additional optical elements OE3 and OE4, which are here embodied as prisms, and which have an opposite angular dispersion, preferably an opposite angular dispersion for at least one wavelength in the wavelength range of the tunable light source LS.

Although the dispersion compensating optical elements OE3, OE4 have been embodied as prisms, e.g. refractive prisms, the optical elements may also be embodied differently as long as they have the opposite dispersion allowing to at least partially compensate for the dispersion caused by the acousto-optic modulator AOM, e.g. in the form of a reflective grating or a transmissive grating.

In case of using a reflective or transmissive grating, the pitch of the grating is preferably identical to the pitch of the standing wave of the acousto-optic modulator AOM. In case of the use of a refractive prism, the dispersion of the prism can be matched to the dispersion of the acousto-optic modulator AOM by properly choosing the material and wedge angle of the prism.

Dispersion compensation optical elements similar to the optical elements OE3, OE4 may also be used at other locations in the optical paths, e.g. as shown in FIG. 4 in dashed lines for optical elements OE5 and OE6. The optical elements OE5, OE6 may for instance be used to compensate for dispersion caused by the first optical element OE1. As the dispersion caused by the first optical element OE1 for radiation originating from the first optical fiber OF1 may be different from the dispersion caused for radiation originating from the second optical fiber OF2, the optical elements OE5, OE6 are preferably arranged in the respective optical paths upstream of the first optical path, so that each optical element OE5, OE6 can be matched to compensate for dispersion in the respective optical path.

Hence, although the invention has been described in relation to the embodiment of FIG. 2, which embodiment includes a time-of-flight measurement principle, the dispersion compensation may also be applied to other type of position measurement systems, resulting in that the invention also relates to a position measurement system configured to measure a position of an object, comprising:
  a tunable light source, e.g. a tunable heterodyne laser source;
  an acousto-optic modulator for acting on radiation emitted by the tunable light source;
  a dispersion compensator, e.g. a refractive prism, a reflective grating or a transmissive grating for acting on the same radiation as the acousto-optic modulator.

In an embodiment, a dispersion caused by the dispersion compensator is substantially opposite to a dispersion caused by the acousto-optic modulator, at least for one wavelength of the tunable light source.

In an embodiment, the position measurement system comprises one or more of the features described in relation to other embodiments or aspects of the invention.

In an embodiment, the position measurement system is configured to sweep the wavelength of the radiation emitted by the tunable light source for absolute distance metrology, which may alternatively be referred to as frequency modulation of a continuous laserwave.

Although the optical elements OE3 and OE4 have been arranged in between the first beam splitter BS1 and the acousto-optic modulators AOM, it will be apparent to the skilled person that the optical elements can also be arranged at other locations in between the light source and the optical fibers OF1, OF2.

Embodiments are provided in accordance with the following clauses:

1. A position measurement system configured to measure a position of an object, comprising:
   a displacement interferometer having a first capture range;
   a time-of-flight sensor having a second capture range that is larger than the first capture range and having an inaccuracy that is smaller than the first capture range; and
   a processing unit,
   wherein the position measurement system has a zeroing mode
      in which the processing unit is configured to determine a coarse position of the object within the second capture range based on an output from the time-of-flight sensor, and
      in which the processing unit is configured to determine a fine position of the object based on the determined coarse position and an output from the displacement interferometer.

2. A position measurement system according to clause 1, wherein the displacement interferometer is a multiwavelength interferometer with an effective wavelength formed by combining information from different wavelengths, wherein the first capture range corresponds to a capture range of the effective wavelength, wherein in the zeroing mode the processing unit is configured to determine a refined position of the object within the first capture range based on the determined coarse position and an output from the displacement interferometer related to the effective wavelength, wherein in the zeroing mode the processing unit is configured to determine the fine position of the object based on the determined refined position and an output from the displacement interferometer related to one of the different wavelengths, and wherein an inaccuracy of the determined refined position is smaller than a third capture range of the one of the different wavelengths.

3. A position measurement system according to clause 1 or clause 2, wherein the displacement interferometer comprises:
   an optical system configured to obtain a first measurement beam guided along a first optical path without interacting with the object, to obtain a second measurement beam guided along a second optical path different from the first optical path, and to allow the first and second measurement beam to at least partially interfere with each other after interaction of the second measurement beam with the object to form a first detection beam; and
   a first detector to receive the first detection beam,
   wherein the time-of-flight sensor is configured to provide a modulated measurement beam guided along the second optical path, and
   wherein the processing unit in the zeroing mode of the position measurement system is configured to determine the coarse position based on a time-of-flight of the modulated measurement beam to the first detector.

4. A position measurement system according to clause 3, wherein the time-of-flight sensor is configured to provide another modulated measurement beam guided along a third optical path having a fixed optical path length, wherein the time-of-flight sensor comprises a second detector to receive the other modulated measurement beam, wherein the processing unit in the zeroing mode of the position measurement system is configured to determine the coarse position based on a difference between the time-of-flight of the modulated measurement beam to the first detector and a time-of-flight of the other modulated measurement beam to the second detector.

5. A position measurement system according to clause 3 or clause 4, wherein the modulated measurement beam is formed by mixing two different radiation beams outputted by a heterodyne light source such that the modulated measurement beam has a modulation frequency equal to a difference in frequency between the two radiation beams.

6. A position measurement system according to any of clauses 3-5, wherein the modulated measurement beam is phase modulated, amplitude modulated or polarization modulated.

7. A position measurement system according to any of clauses 1-6, wherein the time-of-flight sensor and the displacement interferometer share at least one optical component.

8. A position measurement system according to any of clauses 1-7, wherein the displacement interferometer is a multi-pass interferometer.

9. A lithographic apparatus comprising a position measurement system according to any of clauses 1-8, wherein the object is part of the lithographic apparatus.

10. A lithographic apparatus comprising a position measurement system according to clause 9, comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate; and
    a projection system configured to project the patterned radiation beam onto a target portion of the substrate,
    wherein the object comprises one of a part of the projection system, the support and the substrate table.

11. A method for zeroing a position measurement system configured to measure a position of an object, comprising:
    a displacement interferometer having a first capture range; and
    a time-of-flight sensor having a second capture range that is larger than the first capture range and having an inaccuracy that is smaller than the first capture range,
    wherein the method comprises the following steps:
    a) determining a coarse position of the object within the second capture range using the time-of-flight sensor; and
    b) determining a fine position of the object using the displacement interferometer and the determined coarse position.

12. A method according to clause 11, wherein the time-of-flight sensor and the displacement interferometer are integrated.

13. A method according to clause 11 or clause 12, wherein steps a) and b) are carried out after each other, wherein during steps a) the position measurement system functions only as time-of-flight sensor, and wherein after step b) the position measurement system is adjusted to function only as displacement interferometer to carry out step b).

14. A method according to any of clauses 11-13, wherein the displacement interferometer is a multiwavelength interferometer with an effective wavelength formed by combining information from different wavelengths, wherein the first capture range corresponds to the capture range of the effective wavelength, and wherein step b) comprises the following sub-steps:
   b1) determining a refined position of the object within the first capture range using the effective wavelength of the displacement interferometer and the determined coarse position; and
   b2) determining the fine position of the object based on an individual wavelength of the displacement interferometer and the refined position,
   wherein an inaccuracy of the determined refined position is smaller than a third capture range of the individual wavelength.

15. A device manufacturing method wherein use is made of a position measurement system according to any of clauses 1-9 or the lithographic apparatus according to clause 10 or clause 11.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position measurement system configured to measure a position of an object, the position measurement system comprising:
   an output configured to provide a first radiation beam and a second radiation beam;
   an optical system configured to provide a first measurement beam based on the first radiation beam and provide a second measurement beam and a fourth measurement beam, based on the second radiation beam;
   a first detector configured to receive the first radiation beam and the second radiation beam;
   a second detector configured to receive the fourth radiation beam;
   a displacement interferometer arranged to determine the position based on interference of the first radiation beam and the second radiation beam; and
   a time-of-flight sensor arranged to determine the position based on time-of-flight based on the second measurement beam and the fourth measurement beam.

2. The position measurement system according to claim 1, wherein the optical system is arranged to provide a third measurement beam based on the first radiation beam, wherein the second detector is arranged to receive the third measurement beam, and wherein the displacement interferometer is arranged to determine the position based on interference of the third radiation beam and the fourth radiation beam.

3. The position measurement system according to claim 1, wherein the displacement interferometer has a first capture range, wherein the time-of- flight sensor has a second capture range that is larger than the first capture range, and wherein the time-of-flight sensor has an inaccuracy that is smaller than the first capture range.

4. The position measurement system according to claim 3, further comprising a processing unit, wherein the position measurement system has a zeroing mode in which the processing unit is configured to determine a coarse position of the object within the second capture range based on an output of the time-of-flight sensor, and in which the processing unit is configured to determine a fine position of the object based on the coarse position and an output from the displacement interferometer.

5. The position measurement system according to claim 4, wherein the displacement interferometer is a multiwavelength interferometer with an effective wavelength formed by combining information from different wavelengths, wherein the first capture range corresponds to a capture range of the effective wavelength, wherein, in the zeroing mode, the processing unit is configured to determine a refined position of the object within the first capture range based on the determined coarse position and an output from the displacement interferometer related to the effective wavelength, wherein, in the zeroing mode, the processing unit is configured to determine the fine position of the object based on the determined refined position and an output from the displacement interferometer related to one of the different wavelengths, and wherein an inaccuracy of the determined refined position is smaller than a third capture range of the one of the different wavelengths.

6. The position measurement system according to claim 1, wherein the time-of-flight sensor comprises a modulator to modulate the second radiation beam with a modulated signal.

7. The position measurement system according to claim 6, wherein a modulation frequency of the modulated signal is substantially different from a difference in frequency between the first radiation beam and the second radiation beam.

8. The position measurement system according to claim 1, further comprising two polarizers operable to either interact or not to interact with the first radiation beam and the second radiation beam,
wherein, when the two polarizers interact with the first radiation beam and the second radiation beam, the position measurement system operates as the displacement interferometer,
wherein, when the two polarizers do not interact with the first radiation beam and the second radiation beam, the position measurement system operates as the time-of-flight sensor.

9. The position measurement system according to claim 1, wherein the optical system is configured to guide the first measurement beam along a first optical path without interacting with the object, to guide the second measurement beam along a second optical path different from the first optical path, and to allow the first and second measurement beams to at least partially interfere with each other after interaction of the second measurement beam with the object to form a first detection beam.

10. A lithographic apparatus comprising the position measurement system according to claim 1, wherein the object is in or part of the lithographic apparatus.

11. The lithographic apparatus of claim 10, comprising:
a support constructed to support a patterning device, the patterning device capable of imparting a radiation beam with a pattern in its cross-section to form a patterned radiation beam;
a substrate table constructed to hold a substrate; and
a projection system configured to project the patterned radiation beam onto a target portion of the substrate,
wherein the object comprises a part of the projection system, the support or the substrate table.

12. A device manufacturing method comprising using the position measurement system according to claim 1.

13. A method for a position measurement system configured to measure a position of an object, the position measurement system comprising:
a displacement interferometer having a first capture range; and
a time-of-flight sensor having a second capture range that is larger than the first capture range and having an inaccuracy that is smaller than the first capture range,
wherein the method comprises:
determining a coarse position of the object within the second capture range using the time-of-flight sensor; and
determining a fine position of the object using the displacement interferometer and the determined coarse position.

14. The method according to claim 13, further comprising:
providing a first radiation beam and a second radiation beam;
providing a first measurement beam and a third measurement beam based on the first radiation beam and providing a second measurement beam and a fourth measurement beam based on the second radiation beam;
determining the coarse position based on time-of-flight based on the second measurement beam and the fourth measurement beam;
determining the fine position based on:
i) interference of the first radiation beam and the third radiation beam, or
ii) interference of the first radiation beam and the third radiation beam and on interference of the second radiation beam and the fourth radiation beam.

15. The method according to claim 13, wherein the determining the coarse position and fine position are carried out after each other, wherein for determining the coarse position the position measurement system is adjusted to function only as the time-of-flight sensor, and wherein for determining the fine position the position measurement system is adjusted to function only as the displacement interferometer.

16. A device manufacturing method comprising using performing the method according to claim 12.

17. A position measurement system configured to measure a position of an object, the position measurement system comprising:
a displacement interferometer having a first capture range;
a time-of-flight sensor having a second capture range that is larger than the first capture range and having an inaccuracy that is smaller than the first capture range; and
a processing system configured to at least:
determine a coarse position of the object within the second capture range using the time-of-flight sensor; and
determine a fine position of the object using the displacement interferometer and the determined coarse position.

18. The position measurement system according to claim 17, wherein the processor system is further configured to:
cause provision of a first radiation beam and a second radiation beam;
cause provision of a first measurement beam and a third measurement beam based on the first radiation beam and providing a second measurement beam and a fourth measurement beam based on the second radiation beam;
determining the coarse position based on time-of-flight based on the second measurement beam and the fourth measurement beam; and
determining the fine position based on:
iii) interference of the first radiation beam and the third radiation beam, or
iv) interference of the first radiation beam and the third radiation beam and on interference of the second radiation beam and the fourth radiation beam.

19. The position measurement system according to claim 17, wherein the processor system is configured to cause:
the determining of the coarse position and fine position to be carried out after each other,
for the determining of the coarse position, the position measurement system to be adjusted to function only as the time-of-flight sensor, and
for the determining of the fine position, the position measurement system be adjusted to function only as the displacement interferometer.

20. A lithographic apparatus comprising the position measurement system according to claim 17, wherein the object is in or part of the lithographic apparatus.

* * * * *

UNITED STATES PATENT AND TRADEMARK OFFICE
CERTIFICATE OF CORRECTION

PATENT NO. : 10,883,816 B2  
APPLICATION NO. : 16/489439  
DATED : January 5, 2021  
INVENTOR(S) : Jansen Page 1 of 1

It is certified that error appears in the above-identified patent and that said Letters Patent is hereby corrected as shown below:

In the Claims

In Column 19, Lines 12-23:
Please change Claim 8 to the following:
8. The position measurement system according to claim 16, further comprising two polarizers operable to either interact or not to interact with the first radiation beam and the second radiation beam,
    wherein, when the two polarizers interact with the first radiation beam and the second radiation beam, the position measurement system operates as the time-of-flight sensor,
    wherein, when the two polarizers do not interact with the first radiation beam and the second radiation beam, the position measurement system operates as the displacement interferometer.

Signed and Sealed this  
Thirtieth Day of November, 2021

Drew Hirshfeld  
*Performing the Functions and Duties of the*  
*Under Secretary of Commerce for Intellectual Property and*  
*Director of the United States Patent and Trademark Office*